(12) United States Patent
Liu et al.

(10) Patent No.: US 10,439,610 B2
(45) Date of Patent: Oct. 8, 2019

(54) FORCE TOUCH DETECTION CIRCUIT, METHOD AND DISPLAY PANEL

(71) Applicant: SHANGHAI TIANMA MICRO-ELECTRONICS CO., LTD., Shanghai (CN)

(72) Inventors: Liang Liu, Shanghai (CN); Feng Lu, Shanghai (CN); Conghua Ma, Shanghai (CN); Shaolong Ma, Shanghai (CN); Zaiwen Zhu, Shanghai (CN); Qitai Ji, Shanghai (CN); Yuheng Zhang, Shanghai (CN); Shui He, Shanghai (CN); Yong Yuan, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 111 days.

(21) Appl. No.: 15/865,169

(22) Filed: Jan. 8, 2018

(65) Prior Publication Data
US 2018/0131373 A1    May 10, 2018

(30) Foreign Application Priority Data
Jul. 28, 2017 (CN) .......................... 2017 1 0631959

(51) Int. Cl.
*H03K 17/96* (2006.01)
*G06F 3/041* (2006.01)
*H01L 27/32* (2006.01)

(52) U.S. Cl.
CPC ....... *H03K 17/9625* (2013.01); *G06F 3/0414* (2013.01); *G06F 3/0416* (2013.01); *H01L 27/3244* (2013.01); *G06F 2203/04103* (2013.01)

(58) Field of Classification Search
CPC ............................................. G06F 2203/04105
See application file for complete search history.

(56) References Cited

U.S. PATENT DOCUMENTS

2008/0117345 A1*  5/2008  Ishii .................. G02F 1/136204
                                                          349/40
2018/0260062 A1*  9/2018  Ji ............................ G06F 3/0412

FOREIGN PATENT DOCUMENTS

CN          106097946 A       11/2016

* cited by examiner

*Primary Examiner* — Priyank J Shah
(74) *Attorney, Agent, or Firm* — Kilpatrick Townsend & Stockton LLP

(57) ABSTRACT

The present disclosure provides a force touch detection circuit, a force touch detection circuit method and a display panel. The force touch detection circuit includes: n force-sensing sensors, n first switches, a first end of the $i^{th}$ first switch being electrically connected with a first end of the $i^{th}$ force-sensing sensor, a second end of the $i^{th}$ first switch being electrically connected with a first test connection terminal; n second switches, a first end of the $i^{th}$ second switch being electrically connected with a second end of the $i^{th}$ force-sensing sensor, a second end of the $i^{th}$ second switch being electrically connected with a second test connection terminal; n control signal connection terminals, the $i^{th}$ control signal connection terminal is electrically connected with a control end of the $i^{th}$ first switch and a control end of the $i^{th}$ second switch.

18 Claims, 9 Drawing Sheets

FORCE TOUCH DETECTION CIRCUIT, METHOD AND DISPLAY PANEL

CROSS-REFERENCE TO RELATED APPLICATIONS

The present application claims priority to Chinese Patent Application No. 201710631959.9, filed on Jul. 28, 2017, the content of which is incorporated herein by reference in its entirety.

TECHNICAL FIELD

The present disclosure relates to the field of display technologies and, more particularly, to a force touch detection circuit, a force touch detection method and a display panel.

BACKGROUND

With the development of touch display technologies, in addition to the traditional touch technology capable of detecting touch position, a force touch technology capable of detecting magnitude of touch force is also appeared, by which more convenient human-machine interaction can be achieved. A force-sensing sensor is a necessary element to achieve force touch.

The force-sensing sensor is integrated in a display panel, but due to manufacturing process and other reasons, a defective force-sensing sensor may be caused by disconnection of wires or other reasons, resulting in that the finally formed display panel cannot work properly due to the defective force-sensing sensor, which may lead to process material waste in the following processes.

SUMMARY

The present disclosure provides a force touch detection circuit, a force touch detection circuit method and a force touch detection circuit display panel, which can perform force touch detection during production of the display panel, so as to decide in advance whether the force-sensing sensor is defective, thereby avoiding process material waste in the following process.

The present disclosure provides a force touch detection circuit, including: n force-sensing sensors, n being an integer greater than 1; a first test connection terminal, a second test connection terminal; n first switches, a first end of an $i^{th}$ one of the n first switches being electrically connected with a first end of an $i^{th}$ one of the n force-sensing sensors, a second end of the $i^{th}$ first switch being electrically connected with the first test connection terminal; n second switches, a first end of an $i^{th}$ one of the n second switches being electrically connected with a second end of the $i^{th}$ force-sensing sensor, a second end of the $i^{th}$ second switch being electrically connected with the second test connection terminal; and n control signal connection terminals, an $i^{th}$ one of the n control signal connection terminals being electrically connected with a control end of the $i^{th}$ first switch and a control end of the $i^{th}$ second switch.

In another aspect, the present disclosure further provides a force touch detection method applied in a force touch detection circuit, and the force touch detection circuit includes: n force-sensing sensors, n being an integer greater than 1; a first test connection terminal, a second test connection terminal; n first switches, a first end of an $i^{th}$ one of the n first switches being electrically connected with a first end of an $i^{th}$ one of the n force-sensing sensors, a second end of the $i^{th}$ first switch being electrically connected with the first test connection terminal; n second switches, a first end of an $i^{th}$ one of the n second switches being electrically connected with a second end of the $i^{th}$ force-sensing sensor, a second end of the $i^{th}$ second switch being electrically connected with the second test connection terminal; and n control signal connection terminals, an $i^{th}$ one of the n control signal connection terminals being electrically connected with a control end of the $i^{th}$ first switch and a control end of the $i^{th}$ second switch; the force touch detection method includes: providing, by the $i^{th}$ control signal connection terminal, an enable signal for turning on both the $i^{th}$ first switch and the $i^{th}$ second switch, and providing, by all touch connection terminals except the $i^{th}$ control signal connection terminal, a non-enable signal for turning off each of the first switches except the $i^{th}$ first switch and each of the second switches except the $i^{th}$ second switch, in an $i^{th}$ force touch detection time period of n force touch detection time periods.

In another aspect, the present disclosure further provides a force touch detection method applied in a force touch detection circuit, the force touch detection circuit including: n force-sensing sensors, n being an integer greater than 1; a first test connection terminal, a second test connection terminal; n first switches, a first end of an $i^{th}$ one of the n first switches being electrically connected with a first end of an $i^{th}$ one of the n force-sensing sensors, a second end of the $i^{th}$ first switch being electrically connected with the first test connection terminal; n second switches, a first end of an $i^{th}$ one of the n second switches being electrically connected with a second end of the $i^{th}$ force-sensing sensor, a second end of the $i^{th}$ second switch being electrically connected with the second test connection terminal; and n control signal connection terminals, an $i^{th}$ one of the n control signal connection terminals being electrically connected with a control end of the $i^{th}$ first switch and a control end of the $i^{th}$ second switch, the force touch detection circuit including: a non-force touch test signal line electrically connected with each of the control signal connection terminals; n third switches, the $i^{th}$ control signal connection terminal being electrically connected with the control end of the $i^{th}$ first switch and the control end of the $i^{th}$ second switch via an $i^{th}$ one of the n third switches, a first end of the $i^{th}$ third switch being electrically connected with the control end of the $i^{th}$ first switch and the control end of the $i^{th}$ second switch, a second end of the $i^{th}$ third switch being electrically connected with the $i^{th}$ control signal connection terminal; and a test connection terminal electrically connected with a control end of each of the third switches, the force touch detection circuit further including: a non-enable signal connection terminal electrically connected with the control end of each of the first switches and the control end of each of the second switches.

In another aspect, the present disclosure further provides a force touch detection method applied in a force touch detection circuit, the force touch detection circuit including: n force-sensing sensors, n being an integer greater than 1; a first test connection terminal, a second test connection terminal; n first switches, a first end of an $i^{th}$ one of the n first switches being electrically connected with a first end of an $i^{th}$ one of the n force-sensing sensors, a second end of the $i^{th}$ first switch being electrically connected with the first test connection terminal; n second switches, a first end of an $i^{th}$ one of the n second switches being electrically connected with a second end of the $i^{th}$ force-sensing sensor, a second end of the $i^{th}$ second switch being electrically connected with the second test connection terminal; and n control signal connection terminals, an $i^{th}$ one of the n control signal connection terminals being electrically connected with a control end of the $i^{th}$ first switch and a control end of the $i^{th}$ second switch, the force touch detection circuit including: a non-force touch test signal line electrically connected with each of the control signal connection terminals; n third switches, the $i^{th}$ control signal connection terminal being electrically connected with the control end of the $i^{th}$ first switch and the control end of the $i^{th}$ second switch via an $i^{th}$ one of the n third switches, a first end of the $i^{th}$ third switch being electrically connected with the control end of the $i^{th}$ first switch and the control end of the $i^{th}$ second switch, a second end of the $i^{th}$ third switch being electrically connected with the $i^{th}$ control signal connection terminal; and a test connection terminal electrically connected with a control end of each of the third switches, the force touch detection circuit further including: n fourth switches, a first end of an $i^{th}$ one of the n fourth switches being electrically connected with the control end of the $i^{th}$ first switch and the control end of the $i^{th}$ second switch, a control end of each of the fourth switches being electrically connected with the test connection terminal; and a non-enable signal connection terminal electrically connected with a second end of each of the fourth switches; and the fourth switches are P type transistors and the third switches are N type transistors; or the fourth switches are N type transistors and the third switches are P type transistors, the force touch detection method includes: providing, by the test connection terminal, a first signal for turning on each of the third switches and turning off each of the fourth switches, in each of n force touch detection time periods; providing, by the $i^{th}$ control signal connection terminal, an enable signal for turning on the $i^{th}$ first switch and the $i^{th}$ second switch, and providing, by all control signal connection terminals except the $i^{th}$ control signal connection terminal, a non-enable signal for turning off all first switches except the $i^{th}$ first switch and all second switches except the $i^{th}$ second switch, in an $i^{th}$ force touch detection time period of the n force touch detection time periods; and providing, by the test connection terminal, a second signal for turning off each of the third switches and turning on each of the fourth switches, and providing, by the non-enable signal connection terminal, a non-enable signal for turning off each of the first switches and each of the second switches, in a non-force touch detection time period.

In another aspect, the present disclosure further provides a force touch detection circuit, including: n force-sensing sensor connection ends, n non-force touch test signal lines; n test connection terminals; a test switch unit electrically connected with the n force-sensing sensor connection ends, the n non-force touch test signal lines and the n test connection terminals, the test switch unit being configured for switching between a first test status and a second test status, an $i^{th}$ one of the n force-sensing sensor connection ends being conducted with an $i^{th}$ one of the n test connection terminals via the test switch unit in the first test status, an $i^{th}$ one of the n non-force touch test signal lines being conducted with the $i^{th}$ test connection terminal via the test switch unit in the second test status.

In another aspect, the embodiment of the present disclosure further provides a display panel having the above-described force touch detection circuit.

As for the force touch detection circuit, method and display panel in the embodiment of the present disclosure, the first test connection terminal and the second test connection terminal can respectively test devices including the force-sensing sensor in different test stages by cooperation of the first switch, the second switch and the control signal connection terminal, which not only, can perform force touch detection during production of the display panel, so as to decide in advance whether the force-sensing sensor is defective, thereby avoiding process material waste in the following process, but also, reduces the number of the connection terminal by multiplexing the connection terminal in different stages, thereby facilitating realization of a narrow border.

BRIEF DESCRIPTION OF DRAWINGS

The following drawings are in order to illustrate embodiments of the invention.

DESCRIPTION OF EMBODIMENTS

In order to make the purposes, technical solutions and advantages of the present disclosure more clearly, the technical solutions of the present disclosure will be clearly and fully described with reference to the accompanying drawings in the embodiments of the present disclosure. Obviously, the described embodiments are merely exemplary embodiments of the present disclosure, not all of the embodiments. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent a plural form.

Figure 1:
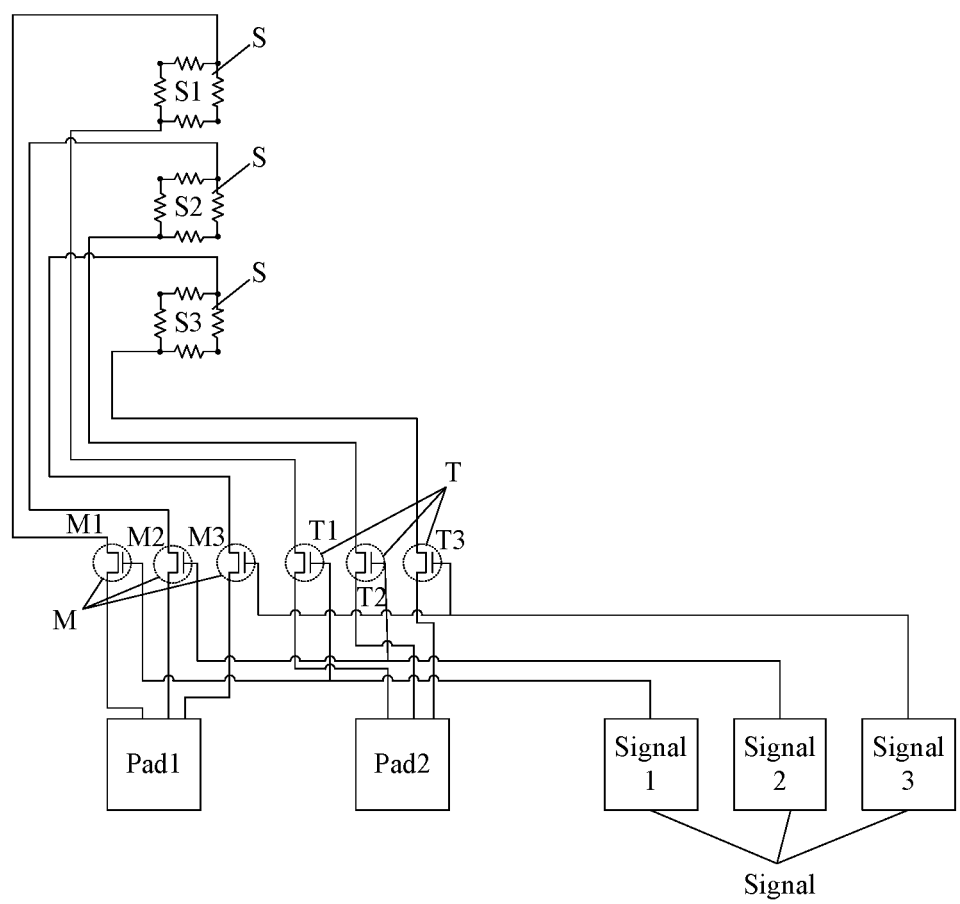
FIG. 1 illustrates a schematic diagram of a force touch detection circuit in an embodiment of the present disclosure.

As shown in FIG. 1, FIG. 1 illustrates a schematic diagram of a force touch detection circuit in an embodiment of the present disclosure. The force touch detection circuit includes: n force-sensing sensors S, n being an integer greater than 1; a first test connection terminal Pad1 and a second test connection terminal Pad2; n first switches M, a first end of an $i^{th}$ first switch M being electrically connected with a first end of an ith force-sensing sensor S, and a second end of the $i^{th}$ first switch M being electrically connected with the first test connection terminal Pad1; n second switches T, a first end of an $i^{th}$ second switch T being electrically connected with a second end of an ith force-sensing sensor S, and a second end of the $i^{th}$ second switch T being electrically connected with the second test connection terminal Pad2; n control signal connection terminals Signal, an $i^{th}$ control signal connection terminal Signal being electrically connected with a control end of the $i^{th}$ first switch M and a control end of the $i^{th}$ second switch T.

In one embodiment, the above-mentioned force touch detection circuit may be described by taking n=3 as an example. As for a first switch M1, a first end of the first switch M1 is electrically connected with a first end of a force-sensing sensor S1, a second end of the first switch M1 is electrically connected with the first test connection terminal Pad1, and a control end of the first switch M1 is electrically connected with a control signal connection terminal Signal1; as for a first switch M2, a first end of the first switch M2 is electrically connected with a first end of a force-sensing sensor S2, a second end of the first switch M2 is electrically connected with the first test connection terminal Pad1, and a control end of the first switch M2 is electrically connected with a control signal connection terminal Signal2; as for a first switch M3, a first end of the first switch M3 is electrically connected with a first end of a force-sensing sensor S3, a second end of the first switch M3 is electrically connected with the test connection terminal Pad1, a control end of the first switch M3 is electrically connected with a control signal connection terminal Signal3; as for a second switch T1, a first end of the second switch T1 is electrically connected with a second end of the force-sensing sensor S1, a second end of the second switch T1 is electrically connected with the second test connection terminal Pad2, a control end of the second switch T1 is electrically connected with the control signal connection terminal Signal1; as for a second switch T2, a first end of the second switch T2 is electrically connected with a second end of the force-sensing sensor S2, a second end of the second switch T2 is electrically connected with the second test connection terminal Pad2, and a control end of the second switch T2 is electrically connected with the control signal connection terminal Signal2; as for a second switch T3, a first end of the second switch T3 is electrically connected with a second end of the force-sensing sensor S3, a second end of the second switch T3 is electrically connected with the second test connection terminal Pad2, and a control end of the second switch T3 is electrically connected with the control signal connection terminal Signal3.

Figure 2:
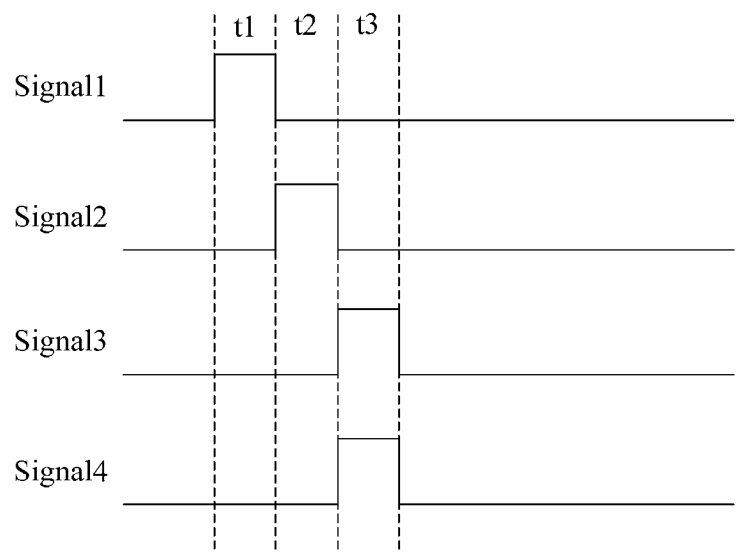
FIG. 2 illustrates a sequence signal diagram of each terminal of the force touch detection circuit in FIG. 1.

As shown in FIGS. 1-2, FIG. 2 illustrates a sequence signal diagram of each terminal of the force touch detection circuit in FIG. 1. An embodiment of the present disclosure provides a force touch detection method applied in the force touch detection circuit shown in FIG. 1, the method includes n force touch detection time periods, in the $i^{th}$ force touch detection time period, the $i^{th}$ control signal connection terminal Signal provides an enable signal, making the $i^{th}$ first switch M and the $i^{th}$ second switch T be turned on. All control signal connection terminals, except for the $i^{th}$ control signal connection terminal, provide non-enable signals, making all first switches M (except the $i^{th}$ first switch M) and all second switches T (except the $i^{th}$ second switch T) be turned off.

In one embodiment, the above-mentioned force touch detection circuit and method may also be described by taking n=3 as an example. The first test connection terminal Pad1 and the second test connection terminal Pad2 are used to be connected with an external test signal terminal, so that the external test signals can be transmitted to a force-sensing sensor on the display panel, so as to test the force-sensing sensor. The control signal connection terminal Signal is also used to be connected with an external signal terminal, so that the external test signal terminal can provide a control signal to the first switch M and the second switch T, so as to achieve controlling of each switch. During a force touch detection time period t1, the control signal connection terminal Signal1 provided an enable signal, making the first switch M1 and the second switch T1 be turned on, and the control signal connection terminals Signal2 and Signal3 provide a non-enable signal, making all of the first switch M2, the first switch M3, the second switch T2 and the second switch T3 be turned off, at this moment, both the first end and the second end of the force-sensing sensor S1 can be tested by the first test connection terminal Pad1 and the second test connection terminal Pad2; during a force touch detection time period t2, the control signal connection terminal Signal2 provides an enable signal, making the first switch M2 and second switch T2 be turned on, the control signal connection terminals Signal1 and Signal3 provide a non-enable signal, making all of the first switch M1, the first switch M3, the second switch T1 and the second switch T3 be turned off, at this moment, both the first end and the second end of the force-sensing sensor S2 can be tested by the first test connection terminal Pad1 and the second test connection terminal Pad2; during a force touch detection time period t3, the control signal connection terminal Signal3 provides an enable signal, making the first switch M3 and the second switch T3 be turned on, the control signal connection terminals Signal1 and Signal2 provide a non-enable signal, making all of the first switch M1, the first switch M2, the second switch T1 and the second switch T2 be turned off, at this moment, both the first end and the second end of the force-sensing sensor S3 can be tested by the first test connection terminal Pad1 and the second test connection terminal Pad2.

It should be noted that, in the present embodiment, the first and second ends of the force-sensing sensor may be two input ends of the force-sensing sensor or two output ends of the force-sensing sensor, during testing the two ends, resistance between the two ends can be directly tested so as to determine whether the force-sensing sensor is normal.

As for the force touch detection circuit and method in the embodiment of the present disclosure, the first test connection terminal and the second test connection terminal can respectively test different force-sensing sensors in different test stages by cooperating with the first switch, the second switch and the control signal connection terminal, which not only can perform force touch detection during production process of the display panel, so as to decide in advance whether the force-sensing sensor is defective, thereby avoiding process material waste in the following processes, but also can reduce the number of the connection terminal by multiplexing the connection terminal in different stages, thereby facilitating realization of a narrow border.

Figure 3:
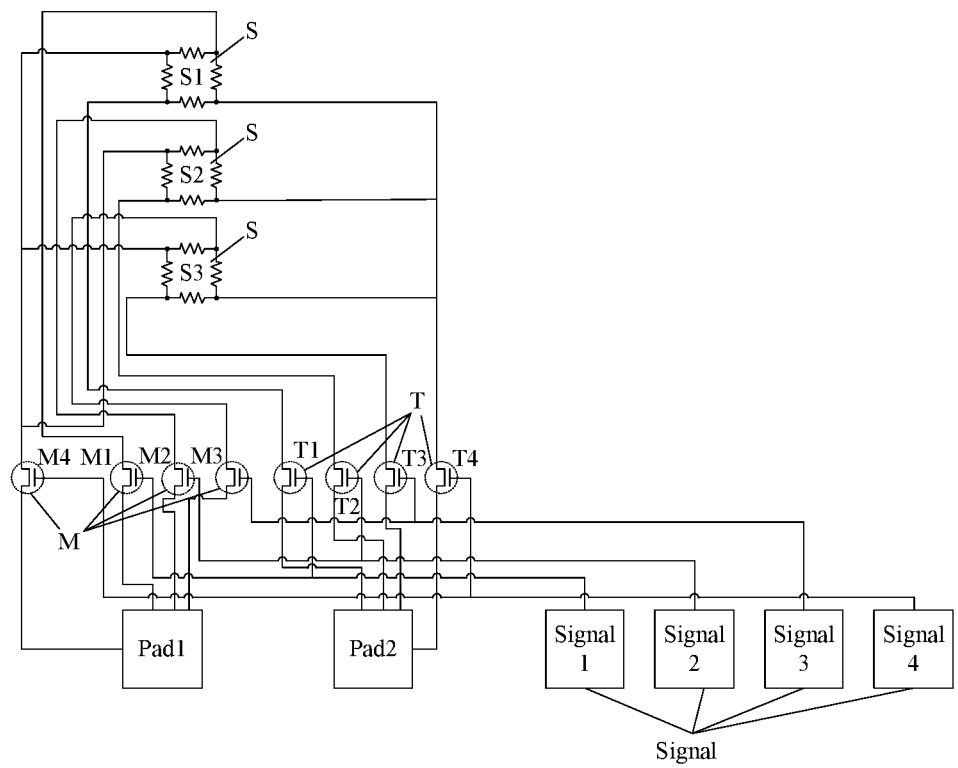
FIG. 3 illustrates a schematic diagram of another force touch detection circuit in an embodiment of the present disclosure.

In one embodiment, as shown in FIG. 3, FIG. 3 illustrates a schematic diagram of another force touch detection circuit in an embodiment of the present disclosure. The first end of the above-mentioned force-sensing sensor S and the second end of the force-sensing sensor S are respectively two output ends of the force-sensing sensors S; the force touch detection circuit further includes: an $(n+1)^{th}$ first switch M4, a first end of the $(n+1)^{th}$ first switch M4 being electrically connected with a first input end of each force-sensing sensor S, and a second end of the $(n+1)^{th}$ first switch M4 being electrically connected with the first test connection terminal Pad1; an $(n+1)^{th}$ second switch T4, a first end of the $(n+1)^{th}$ second switch T4 being electrically connected with a second input end of each force-sensing sensor S, and a second end of the $(n+1)^{th}$ second switch T4 being electrically connected with the second test connection terminal Pad2; an $(n+1)^{th}$ control signal connection terminal Signal4, being electrically connected with both a control end of the $(n+1)^{th}$ first switch M4 and a control end of the $(n+1)^{th}$ second switch T4.

Figure 4:
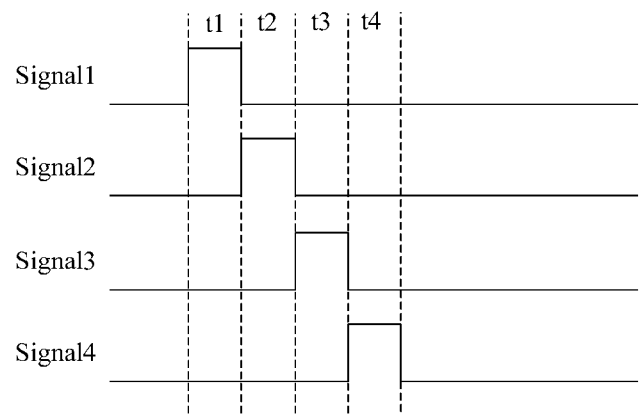
FIG. 4 illustrates a sequence signal diagram of each terminal of the force touch detection circuit in FIG. 3.

In one embodiment, as shown in FIGS. 3-4, FIG. 4 illustrates a sequence signal diagram of each terminal of the force touch detection circuit in FIG. 3. A force touch detection method corresponding to the force touch detection circuit shown in FIG. 3 includes: n+1 force touch detection time periods, in the $i^{th}$ force touch detection time period, the $i^{th}$ control signal connection terminal Signal provides an enable signal, making the $i^{th}$ first switch M and the $i^{th}$ second switch T be turned on. All control signal connection terminals, except for the $i^{th}$ control signal connection terminal, provide non-enable signals, making all first switches M (except the $i^{th}$ first switch M) and all second switches T (except the $i^{th}$ second switch T) be turned off, and i is selected from 1 to (n+1). Compared with the force touch detection circuit shown in FIG. 1, the force touch detection circuit shown in FIG. 3 is further provided with the control signal connection terminal Signal4, the first switch M4 and the second switch T4, correspondingly, as shown in FIG. 4 and FIG. 2, in the force touch detection method, a force touch detection time period t4 is also provided, in this time period, the control signal connection terminal Signal4 provides an enable signal, making the first switch M4 and the second switch T4 be turned on, the control signal connection terminals Signal1, Signal2 and Signal3 respectively provide a non-enable signal, making all the first switches M1, M2 and M3, and the second switches T1, T2 and T3 be turned off, at this moment, two input ends of each force-sensing sensor S can be tested by the first test connection terminal Pad1 and the second test connection terminal Pad2.

Figure 5:
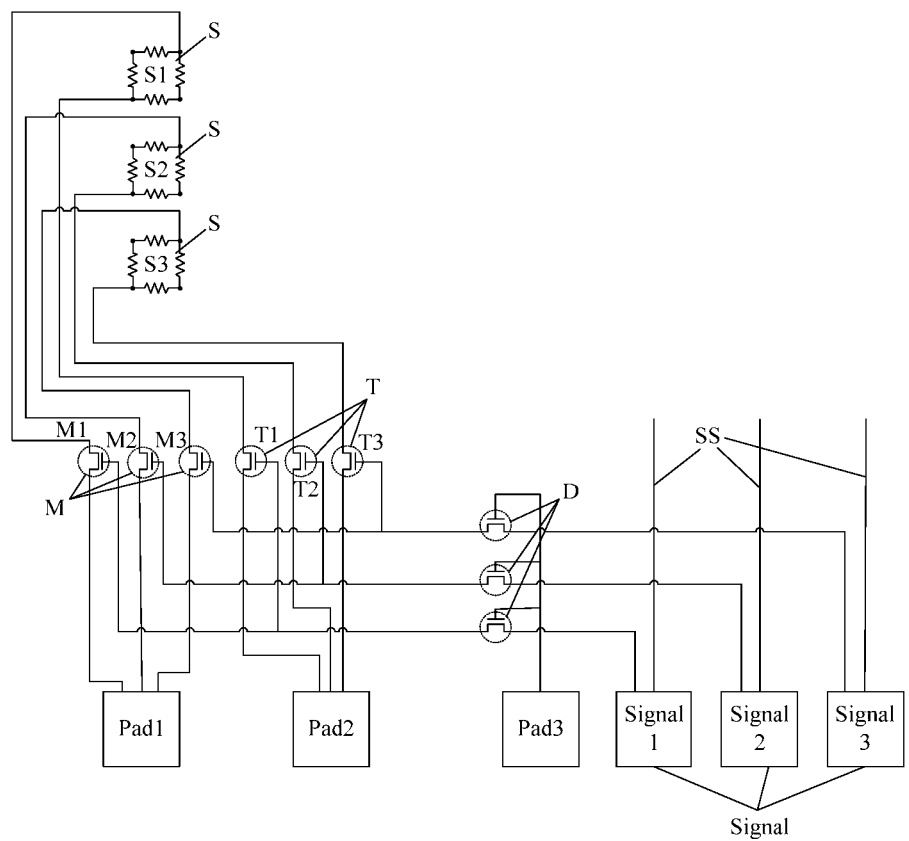
FIG. 5 illustrates a schematic diagram of another force touch detection circuit in an embodiment of the present disclosure.

In one embodiment, as shown in FIG. 5, FIG. 5 illustrates a schematic diagram of another force touch detection circuit in an embodiment of the present disclosure. The force touch detection circuit further includes: a non-force touch test signal line SS electrically connected with each control signal connection terminal Signal; n third switches D, the $i^{th}$ control signal connection terminal Signal being electrically connected with both the control end of the $i^{th}$ first switch M and the control end of the $i^{th}$ second switch T via the $i^{th}$ third switch D, a first end of the $i^{th}$ third switch D being electrically connected with both the control end of the $i^{th}$ first switch M and the control end of the $i^{th}$ second switch T, a second end of the $i^{th}$ third switch D being electrically connected with the $i^{th}$ control signal connection terminal Signal; and a test connection terminal Pad3 electrically connected with a control end of each third switch D.

In one embodiment, the non-force touch test signal line SS can be another type of signal line on the display panel which needs to be tested other than the force-sensing sensor, such as data line corresponding to a display unit. While testing the display panel, there can be a display test stage and a force touch test stage. During the display test stage, an external terminal provides a non-enable signal via the test connection terminal Pad3, making all third switches D be turned off, at this moment, a display test signal can be provided to the non-force touch test signal line SS by the control signal connection terminal Signal, so that the display unit can be tested; after the completion of the display unit test, the force touch test stage gets started, during the force touch test stage, an external terminal provides an enable signal via the test connection terminal Pad3, making all third switches D be turned on, then the force touch test can be performed according to the sequence shown in FIG. 2 by the corresponding force touch test method. The structure shown in FIG. 5 allows the control signal connection terminal Signal to be multiplexed as the terminal in both the force touch test process and the non-force touch test process, thereby further reducing the number of terminals on the display panel, so as to facilitate realization of a narrow border.

Figure 6:
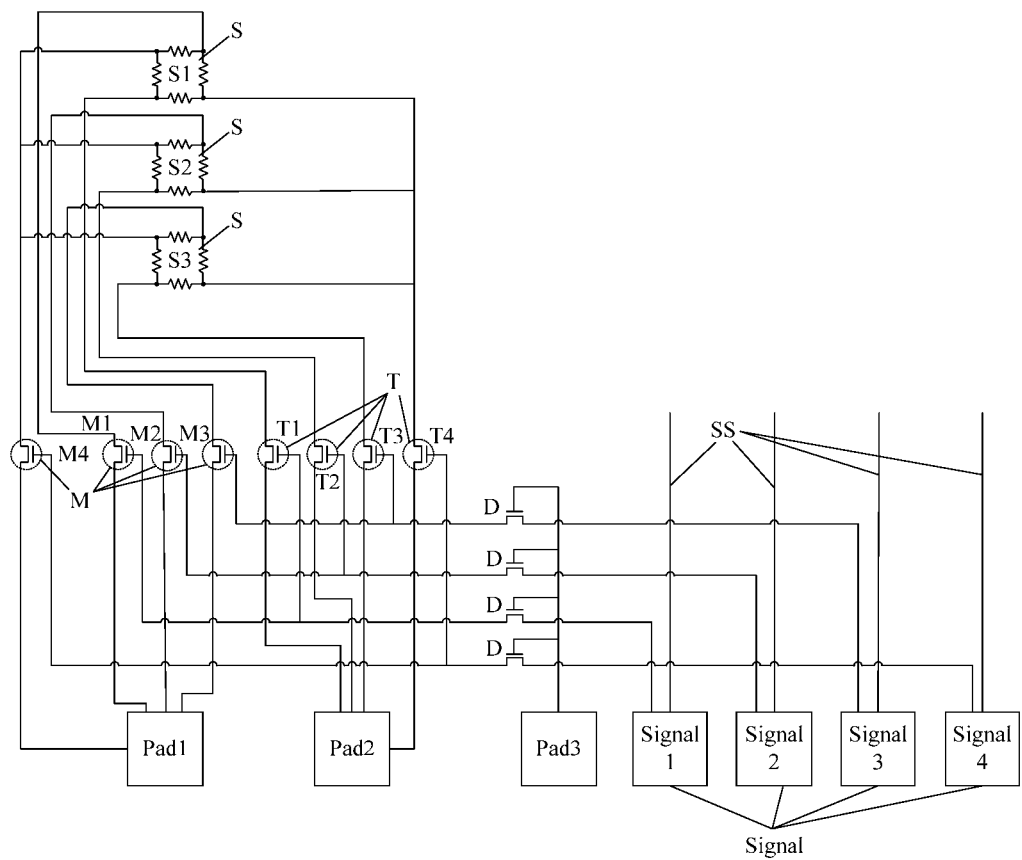
FIG. 6 illustrates a schematic diagram of another force touch detection circuit in an embodiment of the present disclosure.

In one embodiment, as shown in FIG. 6, FIG. 6 illustrates a schematic diagram of another force touch detection circuit in an embodiment of the present disclosure; the force touch detection circuit further includes: a non-force touch test signal line SS electrically connected with each control signal connection terminal Signal; n+1 third switch D, the $i^{th}$ control signal connection terminal Signal being electrically connected with both the control end of the $i^{th}$ first switch M and the control end of the $i^{th}$ second switch T via the $i^{th}$ third switch D, a first end of the $i^{th}$ third switch D being electrically connected with both the control end of the $i^{th}$ first switch M and the control end of the $i^{th}$ second switch T, a second end of the $i^{th}$ third switch D being electrically connected with the $i^{th}$ control signal connection terminal Signal; and a test connection terminal Pad3 electrically connected with a control end of each third switch D.

Compared with the force touch detection circuit shown in FIG. 5, the force touch detection circuit shown in FIG. 6 is further provided with the control signal connection terminal Signal4, the first switch M4, the second switch T4, a third switch D and a non-force touch test signal line SS. Correspondingly, in the force touch detection method, a force touch detection time period is also provided, in this time period, the control signal connection terminal Signal4 provides an enable signal, making the first switch M4 and the second switch T4 be turned on, the control signal connection terminals Signal1, Signal2 and Signal3 respectively provide a non-enable signal, making all the first switches M1, M2 and M3, and the second switches T1, T2 and T3 be turned off, at this moment, two input ends of each force-sensing sensor S can be tested by the first test connection terminal Pad1 and the second test connection terminal Pad2.

Figure 7:
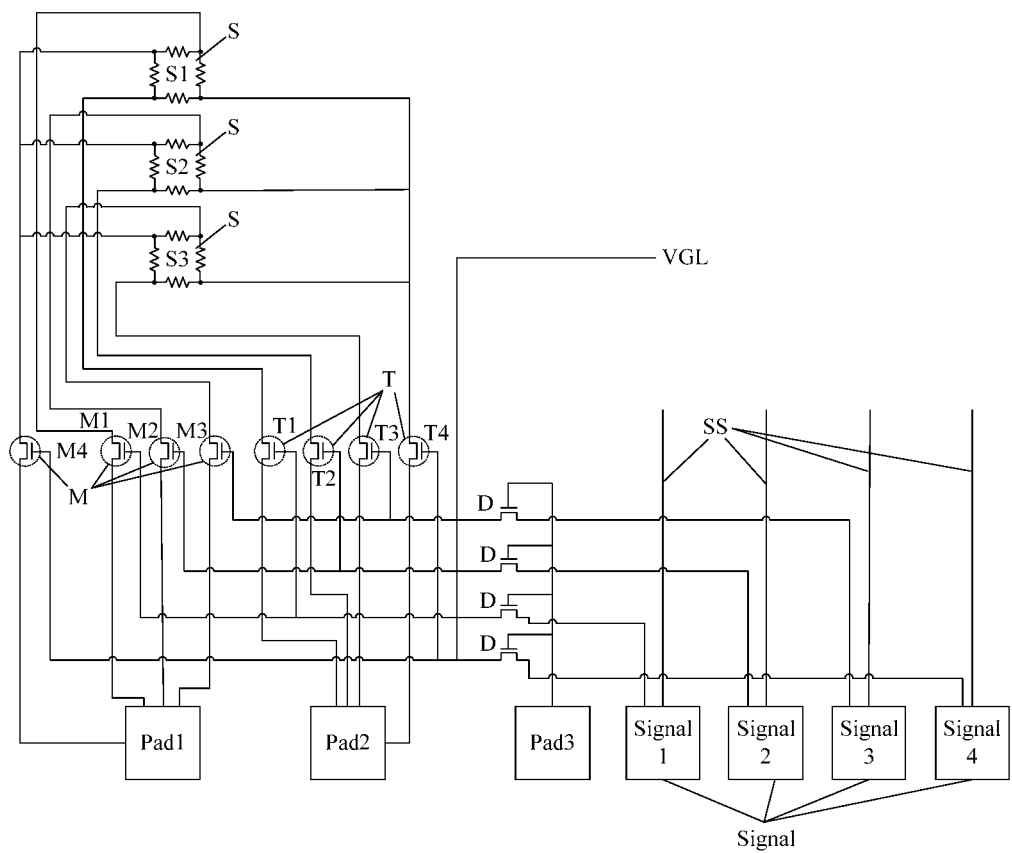
FIG. 7 illustrates another force touch detection circuit in an embodiment of the present disclosure.

In one embodiment, as shown in FIG. 7, FIG. 7 illustrates a schematic diagram of another force touch detection circuit in an embodiment of the present disclosure. The force touch detection circuit further includes: a non-enable signal connection terminal VGL, electrically connected with the control end of each first switch M and the control end of each second switch T.

The embodiment of the present disclosure further provides a force touch detection method applied in the force touch detection circuit shown in FIG. 7, the method includes: n force touch detection time periods, during each force touch detection time period, the non-enable signal connection terminal VGL does not provide a signal, and the test connection terminal Pad3 provides an enable signal, so that each third switch D is turned on, during the $i^{th}$ force touch detection time period, the $i^{th}$ control signal connection terminal Signal provided an enable signal, so that the $i^{th}$ first switch M and the $i^{th}$ second switch T are turned on, all touch connection terminals Signal except the $i^{th}$ control signal connection terminal Signal provide non-enable signals, so that all first switches M (except the $i^{th}$ first switchM) and all second switches T (except the $i^{th}$ second switch T) are turned off; during the non-force touch detection time period, the test connection terminal Pad3 provides a non-enable signal, so that each third switch D is turned off, the non-enable signal connection terminal VGL provides a non-enable signal, so that each first switch M and each second switch T are turned off.

After all tests on the display panel have been completed, the control end of each first switch M and the control end of each first second switch T need to be electrically connected with the non-enable signal connection terminal VGL, and the test connection terminal Pad3 also needs to be electrically connected with the non-enable signal connection terminal VGL. Specifically, it is possible that, after the manufacturing process of the chip of the display panel, the chip is used to provide the non-enable signal connection terminal VGL, after the manufacturing process of the entire display panel, the display panel needs to perform normal display function and force touch function, the circuit on the panel for testing does not need to work after completion of the display panel, but since the circuit still remains on the panel, if the force-sensing sensor S is conducted with the data line (non-force touch test signal line SS) via this circuit, the normal function of the display panel may be adversely affected. In order to avoid this effect, all first switches M and second switches T are controlled to be turned off by the non-enable signal connection terminal VGL, that is, the force-sensing sensor S is not conducted with the data line, and a non-enable signal is provided by the test connection terminal Pad3, so that all third switches D are turned off, that is, the non-enable signal connection terminal VGL is not conducted with the signal line.

It should be noted that, for the structure as shown in FIG. 6, after the test is completed, in order to avoid the influence of the force touch detection circuit on the display panel, it is possible to make the test-related circuit to be insulated from the force-sensing sensor by laser cut-off.

Figure 8:
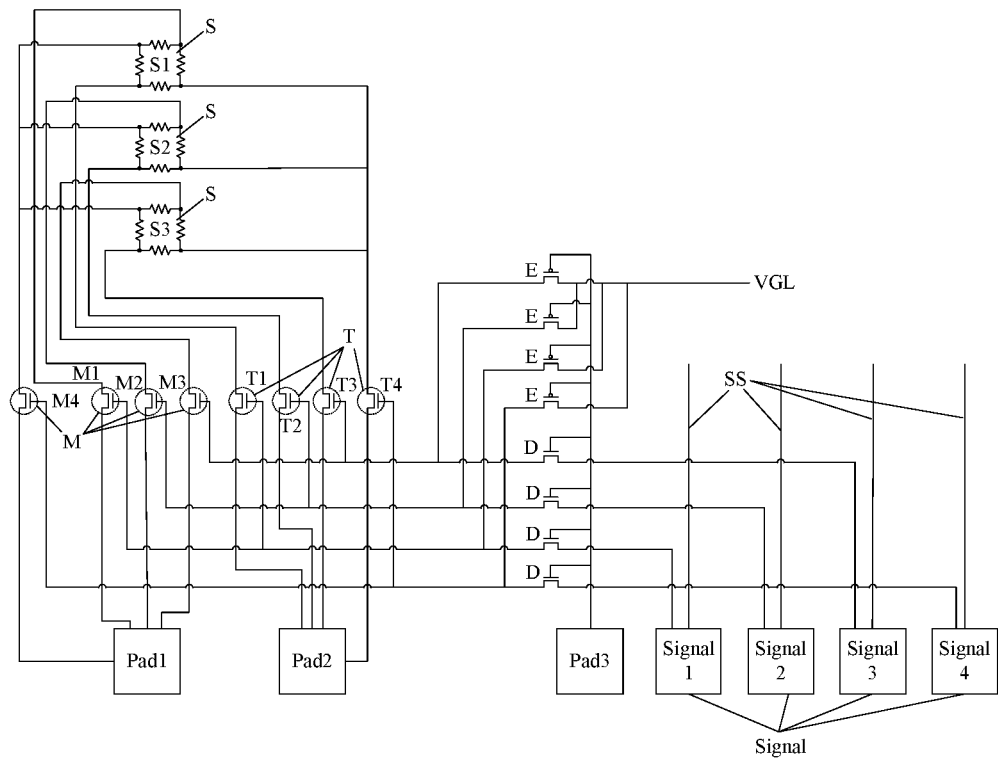
FIG. 8 illustrates a schematic diagram of another force touch detection circuit in an embodiment of the present disclosure.

In one embodiment, as shown in FIG. 8, FIG. 8 illustrates a schematic diagram of another force touch detection circuit in an embodiment of the present disclosure. The force touch detection circuit further includes: n fourth switches E, a first end of the $i^{th}$ fourth switch E is electrically connected with the control end of the $i^{th}$ first switch M and the control end of the $i^{th}$ second switch T, a control end of each fourth switch E is electrically connected with the test connection terminal Pad3; the non-enable signal connection terminal VGL, electrically connected with a second end of each fourth switch E. It is possible that the fourth switches E are P type transistors, and the third switches D are N type transistors; or it is also possible that the fourth switches E are N type transistors, and the third switches D are P type transistors.

The embodiment of the present disclosure further provides a force touch detection method applied in the force touch detection circuit as shown in FIG. 8, the method includes: n force touch detection time periods, during each force touch detection time period, the test connection terminal Pad3 provides a first signal, so that each third switch D is turned on and each fourth switch E is turned off, during the $i^{th}$ force touch detection time period, the $i^{th}$ control signal connection terminal Signal provides an enable signal, so that the $i^{th}$ first switch M and the $i^{th}$ second switch T are turned on, all control signal connection terminals Signal except the $i^{th}$ control signal connection terminal Signal provide non-enable signals, so that all first switches M (except the $i^{th}$ first switch M) and all second switches T (except the $i^{th}$ second switch T) are turned off; during the non-force touch detection time period, the test connection terminal Pad3 provides a second signal, so that each third switch D is turned off and each fourth switch E is turned on, the non-enable signal connection terminal VGL provides a non-enable signal, so that each first switch M and each second switch T are turned off.

After all tests on the display panel have been completed, the control end of each first switch M and the control end of each first second switch T need to be electrically connected with the non-enable signal connection terminal VGL via the fourth switch E. It is possible that, after the manufacturing process of the chip of the display panel, the chip can be used to provide the non-enable signal connection terminal VGL, after the manufacturing process of the entire display panel, the display panel needs to perform normal display function and force touch function, the circuit on the panel for testing does not need to work after completion of the display panel, but since the circuit still remains on the panel, if the force-sensing sensor S is conducted with the data line (non-force touch test signal line SS) via this circuit, the normal function of the display panel may be adversely affected. In order to avoid this effect, after the tests on the display panel have been completed, it is possible to make the test connection terminal Pad3 to be connected with the chip, the chip provides a constant second signal to the test connection terminal Pad3, so that the third switch D is turned off, and the fourth switch E is turned on, all first switches M and all second switches T are controlled to be always turned off by the non-enable signal connection terminal VGL, that is, the force-sensing sensor S is not conducted with the data line, and the non-enable signal connection terminal VGL is not conducted with the data line.

In one embodiment, as shown in FIG. 8, the force touch detection circuit further includes: n+1 fourth switches E, a first end of the $i^{th}$ fourth switch E is electrically connected with the control end of the $i^{th}$ first switch M and the control end of the $i^{th}$ second switch T, a control end of each fourth switch E is electrically connected with the test connection terminal Pad3; and the non-enable signal connection terminal VGL, electrically connected with a second end of each fourth switch E. It is possible that the fourth switches E are P type transistors, and the third switches D are N type transistors; or it is also possible that the fourth switches E are N type transistors, and the third switches D are P type transistors.

Figure 9:
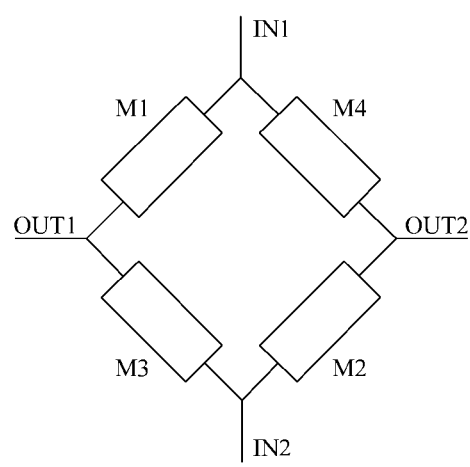
FIG. 9 illustrates a structural schematic diagram of a force-sensing sensor in an embodiment of the present disclosure.

In one embodiment, as shown in FIG. 9, FIG. 9 illustrates a structure schematic diagram of a force-sensing sensor in an embodiment of the present disclosure. The force-sensing sensor is a Wheatstone bridge force sensor. The Wheatstone bridge force sensor includes a first input end IN1, a second input end IN2, a first output end OUT1, a second output end OUT2, a first strain force sensor M1, a second strain force sensor M2, a third strain force sensor M3 and a fourth strain force sensor M4; in each force-sensing unit, the first strain force sensor M1 is connected in series between the first input end IN1 and the first output end OUT1, the second strain force sensor M2 is connected in series between the second input end IN2 and the second output end OUT2, the third strain force sensor M3 is connected in series between the second input end IN2 and the first output end OUT1, the fourth strain force sensor M4 is connected in series between the first input end IN1 and the second output end OUT2.

Figure 10:
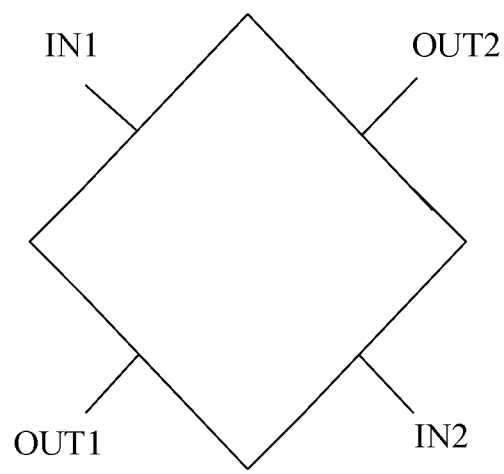
FIG. 10 illustrates a structural schematic diagram of another force-sensing sensor in an embodiment of the present disclosure.

In one embodiment, as shown in FIG. 10, FIG. 10 illustrates a structural schematic diagram of another force-sensing sensor in an embodiment of the present disclosure; the force-sensing sensor is a Silicon piezoresistive force sensor. The Silicon piezoresistive force sensor can be structured as a quadrangle, four sides of which are respectively connected with the first input end IN1, the second input end IN2, the first output end OUT1 and the second output end OUT2, and the first input end IN1 and the second input end IN2 are respectively connected to two opposite sides, and the first output end OUT1 and the second output end OUT2 are respectively connected to the other two opposite sides.

In one embodiment, the above-mentioned non-force touch test signal line can be a display data signal line or a capacitive touch signal line, etc.

Figure 11:
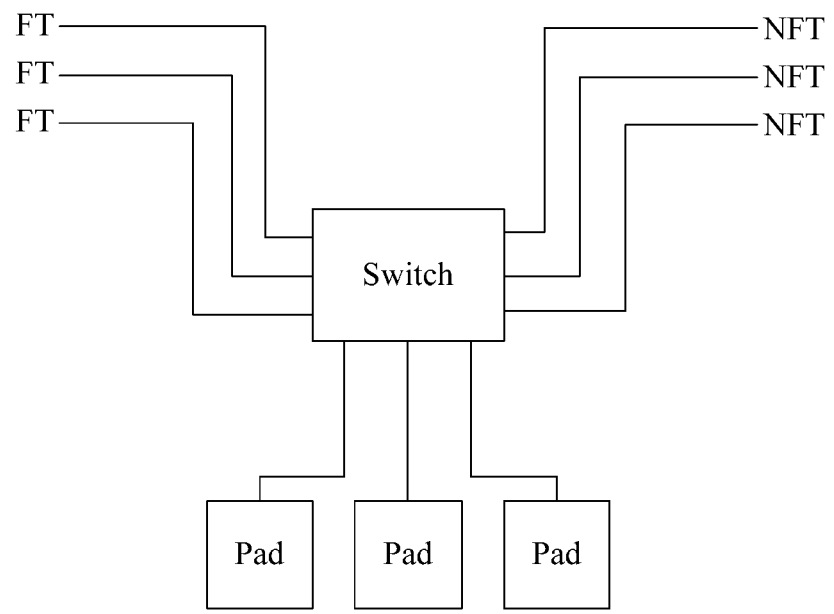
FIG. 11 illustrates a schematic diagram of another force touch detection circuit in an embodiment of the present disclosure.

As shown in FIG. 11, FIG. 11 illustrates a schematic diagram of another force touch detection circuit in an embodiment of the present disclosure. The embodiment of the present disclosure further provides a force touch detection circuit, including: n force-sensing sensor connection ends FT and n non-force touch test signal lines NFT; n test connection terminals Pad; and a test switch unit Switch electrically connected with the n force-sensing sensor connection ends FT, the n non-force touch test signal lines NFT and the n test connection terminals Pad. The test switch unit Switch is used for switching between a first test status and a second test status, in the first test status, the $i^{th}$ force-sensing sensor connection end FT is conducted with the $i^{th}$ test connection terminal Pad via the test switch unit Switch, in the second test status, the $i^{th}$ non-force touch test signal line NFT is conducted with the $i^{th}$ test connection terminal Pad via the test switch unit Switch.

The force-sensing sensor connection end FT is connected with the input end or output end of the force-sensing sensor, the non-force touch test signal line NFT can be a signal line not related to the force touch, such as a display data signal line or a capacitive touch signal line, the display data signal line is connected with the display unit, for providing the data signal to the display unit, so that the display unit displays corresponding color, the capacitive touch signal line is connected with a capacitive touch electrode, the capacitive touch electrode is used for detecting the touch position. During the force touch test time period, the test switch unit Switch is controlled to be in the first test status, making the $i^{th}$ force-sensing sensor connection end be conducted with the $i^{th}$ test connection terminal Pad, then the force-sensing sensor can be tested via the test connection terminal Pad; during the non-force touch test time period, the test switch unit Switch second is controlled to be in the second test status, making the $i^{th}$ non-force touch test signal line NFT be conducted with the $i^{th}$ test connection terminal Pad, then other devices (except for the device for force touch) can be tested via the test connection terminal Pad, such as test on the display unit or test on the capacitive touch electrode, etc.

As for the force touch detection circuit in the embodiment of the present disclosure, the force-sensing sensor and other devices can be respectively tested in different test stages via the test switch unit, which not only can perform force touch detection during production process of the display panel, so as to decide in advance whether the force-sensing sensor is defective, thereby avoiding process material waste in the following processes, but also can reduce the number of the connection terminal by multiplexing the connection terminal in different stages, thereby facilitating realization of a narrow border.

Figure 12:
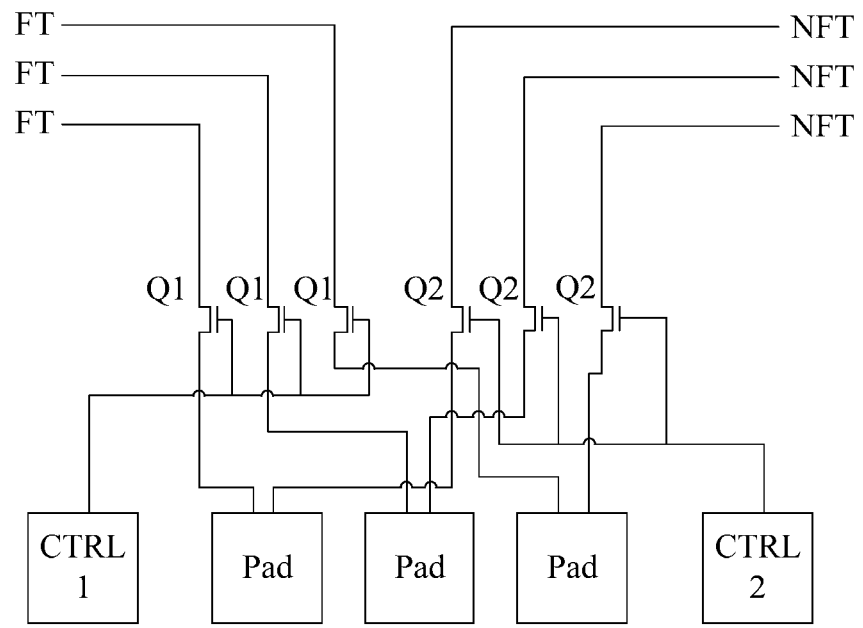
FIG. 12 illustrates a schematic diagram of another force touch detection circuit in an embodiment of the present disclosure.

In one embodiment, as shown in FIG. 12, FIG. 12 illustrates a schematic diagram of another force touch detection circuit in an embodiment of the present disclosure. The test switch unit includes n first switches Q1 and n second switches Q2. A first end of the $i^{th}$ first switch Q1 is electrically connected with the $i^{th}$ force-sensing sensor connection end FT, a second end of the $i^{th}$ first switch Q1 is electrically connected with the $i^{th}$ test connection terminal Pad; a fist end of the $i^{th}$ second switch Q2 is electrically connected with the $i^{th}$ non-force touch test signal line NFT, a second end of the $i^{th}$ second switch Q2 is electrically connected with the $i^{th}$ test connection terminal Pad.

In the first test status, all first switches Q1 are turned on and all second switches Q2 are turned off, at this moment, the $i^{th}$ force-sensing sensor connection end FT is conducted with a corresponding test connection terminal Pad via a corresponding first switch Q1, and the force-sensing sensor then can be tested via the test connection terminal Pad; in the second test status, all first switches Q1 are turned off and all second switches Q2 are turned on, at this moment, the $i^{th}$ non-force touch test signal line NFT is conducted with a corresponding test connection terminal Pad via a corresponding second switch Q2, and then other devices (except for the device for force touch) can be tested via the test connection terminal Pad.

In one embodiment, as shown in FIG. 12, the test switch unit further includes: a first control terminal CTRL1 electrically connected with a control end of each first switch Q1; a second control terminal CTRL2 electrically connected with a control end of each second switch Q2.

The control type of the first switch Q1 and the second switch Q2 will not be limited, for example, both the first switch Q1 and the second switch Q2 are N type transistors or P type transistors; or each first switch Q1 is an N type transistor and each second switch Q2 is a P type transistor; or each first switch Q1 is P type transistor and each second switch Q2 is an N type transistor. While testing, an external device inputs a control signal via the first control terminal CTRL1 and the second control terminal CTRL2 so as to control the first switch Q1 and the second switch Q2, respectively, so that the force-sensing sensor and other devices can be tested in different test stages.

Figure 13:
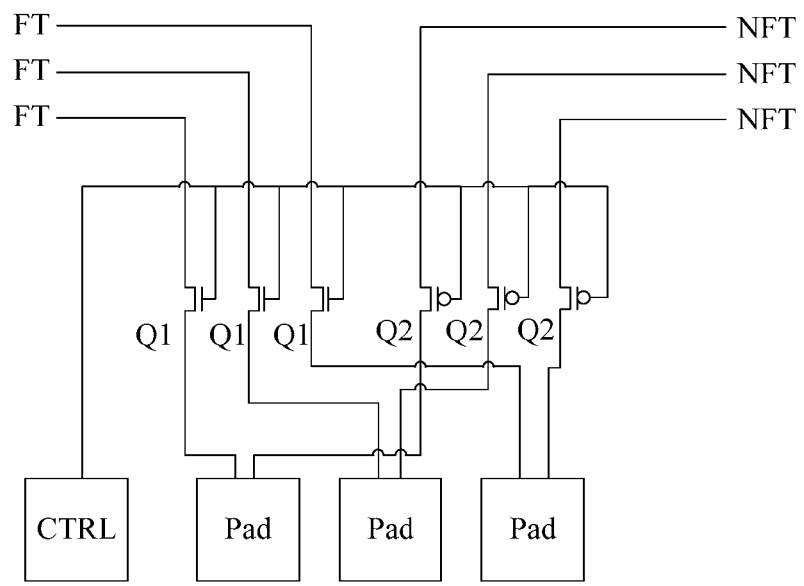
FIG. 13 illustrates a schematic diagram of another force touch detection circuit in an embodiment of the present disclosure.

In one embodiment, as shown in FIG. 13, FIG. 13 illustrates a schematic diagram of another force touch detection circuit in an embodiment of the present disclosure. The test switch unit further includes: a control terminal CTRL electrically connected with both the control end of each first switch Q1 and the control end of each second switch Q2; a first switch Q1 being an N type thin film transistor, a second switch Q2 being a P type thin film transistor; or a first switch Q1 being a P type thin film transistor, a second switch Q2 being an N type thin film transistor.

When the first switch Q1 and the second switch Q2 are opposite control type transistors, it is only needed that the control ends of all first switches Q1 and all second switches Q2 are connected with the control terminal CTRL, for example, the first switch Q1 is an N type thin film transistor, the second switch Q2 is a P type thin film transistor, when a high level signal is supplied to the control terminal CTRL, all first switches Q1 are turned on and all second switches Q2 are turned off, the test switch unit is in the first test status, when a low level signal is supplied to the control terminal CTRL, all first switches Q1 are turned off and all second switches Q2 are turned on, the test switch unit is in the second test status. Compared with the structure shown in FIG. 12, the number of the connection terminal is reduced, thereby facilitating realization of a narrow border.

The embodiment of the present disclosure further provides a display panel, including the above-described force touch detection circuit.

The structure and principle of the force touch detection circuit have been described in the above embodiments and will not be further described herein. The display panel may be a liquid crystal display panel, an organic light-emitting display panel, or a micro light-emitting diode display panel.

For example, when the display panel is a liquid crystal display panel, the display panel includes an array substrate and a color film substrate, and a liquid crystal layer is provided between the array substrate and the color film substrate. A plurality of gate lines and a plurality of data lines are provided on the array substrate and intersect with each other to define a plurality of sub-pixels, each of the sub-pixels is correspondingly provided with a pixel electrode and a thin film transistor, the gate electrode of the thin film transistor is connected with the corresponding data line, the drain electrode of the thin film transistor is connected with the corresponding pixel electrode, the source electrode of the thin film transistor is connected with the corresponding data line. The data line is used for transmitting data signals, the gate line is used for transmitting scan signals. In the operation process of the liquid crystal display panel, the thin film transistors corresponding to the plurality of gate lines are sequentially turned on in rows under the control of the scan signal, meanwhile, the data line sequentially transmits the data signal to the corresponding pixel electrode so that the pixel electrode are charged. As a result, an electric field is formed between the pixel electrode and the common electrode so as to drive the liquid crystal in the liquid crystal layer to deflect so that normal display can be achieved. The color film substrate includes a latticed black matrix and a plurality of color-resisters arranged in an array in an opening of the black matrix, the color-resister includes red-resister, green resister and blue resister.

For example, when the display panel is an organic light-emitting display panel, the organic light-emitting display panel includes an array substrate, the array substrate includes a plurality of pixel circuits, the organic light-emitting display panel further includes a plurality of organic light-emitting diodes (Organic Light-emitting Diode, OLED), the anode of each organic light-emitting diode is correspondingly electrically connected with the pixel circuit on the array substrate, the plurality of light-emitting diodes includes light-emitting diodes for emitting red light, light-emitting diodes for emitting green light, and light-emitting diodes for emitting blue light. In addition, the organic light-emitting display panel further includes a packaging layer covering the plurality of organic light-emitting diodes.

For example, when the display panel is a micro light-emitting diode display panel, the micro light-emitting diode display panel includes an array substrate, the array substrate includes a plurality of pixel circuits, the micro light-emitting diode display panel further includes a plurality of micro light-emitting diodes (Micro Light-Emitting Diode, Mic-LED) arranged on the array substrate, the anode of each micro light-emitting diode is correspondingly electrically connected with the pixel circuit on the array substrate, the plurality of micro light-emitting diodes includes micro light-emitting diodes for emitting red light, micro light-emitting diodes for emitting green light, and micro light-emitting diodes for emitting blue light. The micro-light-emitting diodes can be made on a growth substrate, and then transmitted to array substrate.

Figure 14:
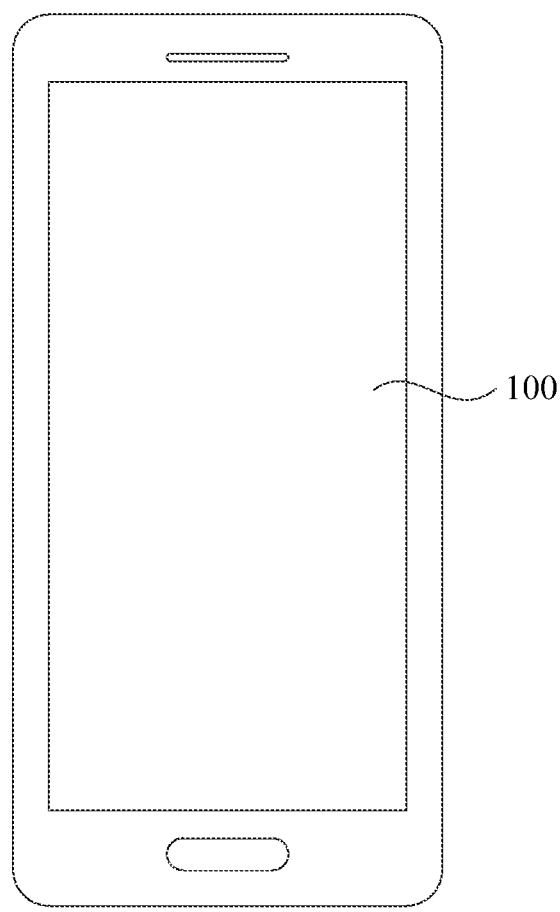
FIG. 14 illustrates a structural schematic diagram of a display device in an embodiment of the present disclosure.

As shown in FIG. 14, FIG. 14 illustrates a structural schematic diagram of a display device in an embodiment of the present disclosure. The display device includes the above-described display panel 100.

The display device may be any electronic device having a display function, such as a touch screen, a cellphone, a tablet computer, a notebook computer, or a television set, etc.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A force touch detection circuit, comprising:
   n force-sensing sensors, n being an integer greater than 1;
   a first test connection terminal;
   a second test connection terminal;
   n first switches, a first end of an $i^{th}$ one of the n first switches being electrically connected with a first end of an $i^{th}$ one of the n force-sensing sensors, a second end of the $i^{th}$ first switch being electrically connected with the first test connection terminal;
   n second switches, a first end of an $i^{th}$ one of the n second switches being electrically connected with a second end of the $i^{th}$ force-sensing sensor, a second end of the $i^{th}$ second switch being electrically connected with the second test connection terminal; and
   n control signal connection terminals, an $i^{th}$ one of the n control signal connection terminals being electrically connected with a control end of the $i^{th}$ first switch and a control end of the $i^{th}$ second switch.

2. The force touch detection circuit as claimed in claim 1, wherein the first end and the second end of each of the n force-sensing sensors are two output ends;
   the force touch detection circuit further comprises:
   an $(n+1)^{th}$ first switch, a first end of the $(n+1)^{th}$ first switch being electrically connected with a first input end of each of the n force-sensing sensors, a second end of the $(n+1)^{th}$ first switch being electrically connected with the first test connection terminal;
   an $(n+1)^{th}$ second switch, a first end of the $(n+1)^{th}$ second switch being electrically connected with a second input end of each of the n force-sensing sensors, a second end of the $(n+1)^{th}$ second switch being electrically connected with the second test connection terminal; and
   an $(n+1)^{r1}$ control signal connection terminal, the $(n+1)^{th}$ control signal connection terminal being electrically connected with a control end of the $(n+1)^{th}$ first switch and a control end of the $(n+1)^{th}$ second switch.

3. The force touch detection circuit as claimed in claim 1, further comprising:
   a non-force touch test signal line electrically connected with each of the control signal connection terminals;
   n third switches, the $i^{th}$ control signal connection terminal being electrically connected with the control end of the $i^{th}$ first switch and the control end of the $i^{th}$ second switch via an i$^{th}$ one of the n third switches, a first end of the i$^{th}$ third switch being electrically connected with the control end of the i$^{th}$ first switch and the control end of the i$^{th}$ second switch, a second end of the i$^{th}$ third switch being electrically connected with the i$^{th}$ control signal connection terminal; and a test connection terminal electrically connected with a control end of each of the third switches.

4. The force touch detection circuit as claimed in claim 2, further comprising:

a non-force touch test signal line electrically connected with each of the control signal connection terminals;

n+1 third switches, the i$^{th}$ control signal connection terminal being electrically connected with the control end of the i$^{th}$ first switch and the control end of the i$^{th}$ second switch via an i$^{th}$ one of the n+1 third switches, a first end of the i$^{th}$ third switch being electrically connected with the control end of the i$^{th}$ first switch and the control end of the i$^{th}$ second switch, a second end of the i$^{th}$ third switch being electrically connected with the i$^{th}$ control signal connection terminal; and a test connection terminal electrically connected with a control end of each of the third switches.

5. The force touch detection circuit as claimed in claim 1, further comprising:

a non-enable signal connection terminal electrically connected with the control end of each of the first switches and the control end of each of the second switches.

6. The force touch detection circuit as claimed in claim 3, further comprising:

n fourth switches, a first end of an i$^{th}$ one of the n fourth switches being electrically connected with the control end of the i$^{th}$ first switch and the control end of the i$^{th}$ second switch, a control end of each of the fourth switches being electrically connected with the test connection terminal; and a non-enable signal connection terminal electrically connected with a second end of each of the fourth switches;

wherein the fourth switches are P type transistors and the third switches are N type transistors; or the fourth switches are N type transistors and the third switches are P type transistors.

7. The force touch detection circuit as claimed in claim 4, further comprising:

n+1 fourth switches, a first end of an i$^{th}$ one of the n+1 fourth switch being electrically connected with the control end of the i$^{th}$ first switch and the control end of the i$^{th}$ second switch, a control end of each of the fourth switches being electrically connected with the test connection terminal; and a non-enable signal connection terminal electrically connected with a second end of each of the fourth switches;

wherein the fourth switches are P type transistors and the third switches are N type transistors; or the fourth switches are N type transistors and the third switches are P type transistors.

8. The force touch detection circuit as claimed in claim 1, wherein each of the force-sensing sensors is a Wheatstone bridge force sensor;

the Wheatstone bridge force sensor comprises a first input end, a second input end, a first output end, a second output end, a first strain force sensor, a second strain force sensor, a third strain force sensor and a fourth strain force sensor;

the first strain force sensor is connected in series between the first input end and the first output end, the second strain force sensor is connected in series between the second input end and the second output end, the third strain force sensor is connected in series between the second input end and the first output end, and the fourth strain force sensor is connected in series between the first input end and the second output end.

9. The force touch detection circuit as claimed in claim 1, wherein, each of the force-sensing sensors is a silicon piezoresistive force sensor.

10. The force touch detection circuit as claimed in claim 4, wherein the non-force touch test signal line is a display data signal line or a capacitive touch signal line.

11. A force touch detection method applied in a force touch detection circuit, wherein the force touch detection circuit comprises:

n force-sensing sensors, n being an integer greater than 1;

a first test connection terminal, a second test connection terminal;

n first switches, a first end of an i$^{th}$ one of the n first switches being electrically connected with a first end of an i$^{th}$ one of the n force-sensing sensors, a second end of the i$^{th}$ first switch being electrically connected with the first test connection terminal;

n second switches, a first end of an i$^{th}$ one of the n second switches being electrically connected with a second end of the i$^{th}$ force-sensing sensor, a second end of the i$^{th}$ second switch being electrically connected with the second test connection terminal; and n control signal connection terminals, an i$^{th}$ one of the n control signal connection terminals being electrically connected with a control end of the i$^{th}$ first switch and a control end of the i$^{th}$ second switch;

the force touch detection method comprises:

providing, by the i$^{th}$ control signal connection terminal, an enable signal for turning on both the i$^{th}$ first switch and the i$^{th}$ second switch, and providing, by all touch connection terminals except the i$^{th}$ control signal connection terminal, a non-enable signal for turning off each of the first switches except the i$^{th}$ first switch and each of the second switches except the i$^{th}$ second switch, in an i$^{th}$ force touch detection time period of n force touch detection time periods.

12. A force touch detection method applied in a force touch detection circuit, the force touch detection circuit comprising:

n force-sensing sensors, n being an integer greater than 1;

a first test connection terminal, a second test connection terminal;

n first switches, a first end of an i$^{th}$ one of the n first switches being electrically connected with a first end of an i$^{th}$ one of the n force-sensing sensors, a second end of the i$^{th}$ first switch being electrically connected with the first test connection terminal;

n second switches, a first end of an i$^{th}$ one of the n second switches being electrically connected with a second end of the i$^{th}$ force-sensing sensor, a second end of the i$^{th}$ second switch being electrically connected with the second test connection terminal; and n control signal connection terminals, an i$^{th}$ one of the n control signal connection terminals being electrically connected with a control end of the i$^{th}$ first switch and a control end of the i$^{th}$ second switch, the force touch detection circuit comprising:

a non-force touch test signal line electrically connected with each of the control signal connection terminals;

n third switches, the $i^{th}$ control signal connection terminal being electrically connected with the control end of the $i^{th}$ first switch and the control end of the $i^{th}$ second switch via an $i^{th}$ one of the n third switches, a first end of the $i^{th}$ third switch being electrically connected with the control end of the $i^{th}$ first switch and the control end of the $i^{th}$ second switch, a second end of the $i^{th}$ third switch being electrically connected with the $i^{th}$ control signal connection terminal; and a test connection terminal electrically connected with a control end of each of the third switches, the force touch detection circuit further comprising:

a non-enable signal connection terminal electrically connected with the control end of each of the first switches and the control end of each of the second switches.

13. A force touch detection method applied in a force touch detection circuit, the force touch detection circuit comprising:

n force-sensing sensors, n being an integer greater than 1;
a first test connection terminal,
a second test connection terminal;
n first switches, a first end of an $i^{th}$ one of the n first switches being electrically connected with a first end of an $i^{th}$ one of the n force-sensing sensors, a second end of the $i^{th}$ first switch being electrically connected with the first test connection terminal;
n second switches, a first end of an $i^{th}$ one of the n second switches being electrically connected with a second end of the $i^{th}$ force-sensing sensor, a second end of the $i^{th}$ second switch being electrically connected with the second test connection terminal; and
n control signal connection terminals, an $i^{th}$ one of the n control signal connection terminals being electrically connected with a control end of the $i^{th}$ first switch and a control end of the $i^{th}$ second switch,
the force touch detection circuit comprising:
a non-force touch test signal line electrically connected with each of the control signal connection terminals;
n third switches, the $i^{th}$ control signal connection terminal being electrically connected with the control end of the $i^{th}$ first switch and the control end of the $i^{th}$ second switch via an $i^{th}$ one of the n third switches, a first end of the $i^{th}$ third switch being electrically connected with the control end of the $i^{th}$ first switch and the control end of the $i^{th}$ second switch, a second end of the $i^{th}$ third switch being electrically connected with the $i^{th}$ control signal connection terminal; and
a test connection terminal electrically connected with a control end of each of the third switches,
the force touch detection circuit further comprising:
n fourth switches, a first end of an $i^{th}$ one of the n fourth switches being electrically connected with the control end of the $i^{th}$ first switch and the control end of the $i^{th}$ second switch, a control end of each of the fourth switches being electrically connected with the test connection terminal; and
a non-enable signal connection terminal electrically connected with a second end of each of the fourth switches;
wherein the fourth switches are P type transistors and the third switches are N type transistors; or the fourth switches are N type transistors and the third switches are P type transistors,
the force touch detection method comprises:
providing, by the test connection terminal, a first signal for turning on each of the third switches and turning off each of the fourth switches, in each of n force touch detection time periods; providing, by the $i^{th}$ control signal connection terminal, an enable signal for turning on the $i^{th}$ first switch and the $i^{th}$ second switch, and providing, by all control signal connection terminals except the $i^{th}$ control signal connection terminal, a non-enable signal for turning off all first switches except the $i^{th}$ first switch and all second switches except the $i^{th}$ second switch, in an $i^{th}$ force touch detection time period of the n force touch detection time periods; and
providing, by the test connection terminal, a second signal for turning off each of the third switches and turning on each of the fourth switches, and providing, by the non-enable signal connection terminal, a non-enable signal for turning off each of the first switches and each of the second switches, in a non-force touch detection time period.

14. A force touch detection circuit, comprising:
n force-sensing sensor connection ends,
n non-force touch test signal lines;
n test connection terminals;
a test switch unit electrically connected with the n force-sensing sensor connection ends, the n non-force touch test signal lines and the n test connection terminals, the test switch unit being configured for switching between a first test status and a second test status, an $i^{th}$ one of the n force-sensing sensor connection ends being conducted with an $i^{th}$ one of the n test connection terminals via the test switch unit in the first test status, an $i^{th}$ one of the n non-force touch test signal lines being conducted with the $i^{th}$ test connection terminal via the test switch unit in the second test status.

15. The force touch detection circuit as claimed in claim 14, wherein the test switch unit comprises n first switches and n second switches;
a first end of an $i^{th}$ one of the n first switches is electrically connected with the $i^{th}$ force-sensing sensor connection end, and a second end of the $i^{th}$ first switch is electrically connected with the $i^{th}$ test connection terminal; and
a first end of an $i^{th}$ one of the n second switches is electrically connected with the $i^{th}$ non-force touch test signal line, and a second end of the $i^{th}$ second switch is electrically connected with the $i^{th}$ test connection terminal.

16. The force touch detection circuit as claimed in claim 15, wherein the test switch unit further comprises:
a first control terminal electrically connected with a control end of each of the first switches; and
a second control terminal electrically connected with a control end of each of the second switches.

17. The force touch detection circuit as claimed in claim 15, wherein the test switch unit further comprises:
a control terminal electrically connected with a control end of each of the first switches and a control end of each of the second switches;
the first switches are N type thin-film transistors and the second switches are P type thin-film transistors; or the first switches are P type thin-film transistors and the second switches are N type thin-film transistors.

18. A display panel comprising:
a force touch detection circuit, wherein the force touch detection circuit comprises:
n force-sensing sensors, n being an integer greater than 1;
a first test connection terminal,
a second test connection terminal;
n first switches, a first end of an $i^{th}$ one of the n first switches being electrically connected with a first end of an $i^{th}$ one of the n force-sensing sensors, a second end of the $i^{th}$ first switch being electrically connected with the first test connection terminal;

n second switches, a first end of an $i^{th}$ one of the n second switches being electrically connected with a second end of the $i^{th}$ force-sensing sensor, a second end of the $i^{th}$ second switch being electrically connected with the second test connection terminal; and n control signal connection terminals, an $i^{th}$ one of the n control signal connection terminals being electrically connected with a control end of the $i^{th}$ first switch and a control end of the $i^{th}$ second switch.

* * * * *